(12) United States Patent
Jin

(10) Patent No.: US 8,323,038 B2
(45) Date of Patent: *Dec. 4, 2012

(54) ELECTRICAL CONNECTOR AND TERMINAL THEREOF

(75) Inventor: Zuo-Feng Jin, Guangzhou (CN)

(73) Assignee: Lotes Co., Ltd., Keelung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/334,243

(22) Filed: Dec. 22, 2011

(65) Prior Publication Data

US 2012/0178298 A1    Jul. 12, 2012

Related U.S. Application Data

(63) Continuation-in-part of application No. 12/930,582, filed on Jan. 11, 2011, now Pat. No. 8,147,256.

(51) Int. Cl.
*H01R 12/00* (2006.01)
(52) U.S. Cl. ............................ 439/83; 439/66
(58) Field of Classification Search ................. 439/83, 439/66, 733.1, 824, 81, 343, 76, 78, 874, 439/876, 884, 855

See application file for complete search history.

(56) References Cited

U.S. PATENT DOCUMENTS

| 5,730,606 | A  | * | 3/1998 | Sinclair | 439/70 |
| 7,791,443 | B1 | * | 9/2010 | Ju | 336/107 |
| 7,922,548 | B2 | * | 4/2011 | Fan | 439/862 |
| 8,118,603 | B2 | * | 2/2012 | Ho | 439/70 |

FOREIGN PATENT DOCUMENTS

CN        201122775 Y    9/2008

* cited by examiner

*Primary Examiner* — Renee Luebke
*Assistant Examiner* — Harshad Patel
(74) *Attorney, Agent, or Firm* — Li & Cai Intellectual Property (USA) Office

(57) ABSTRACT

An electrical connector includes an insulating housing and a plurality of terminals. The terminal includes a base having an upper end and a lower end, a flexible arm extending upward from the upper end of the base, a retaining portion extending upward from the upper end of the base, and at least one holding leg extended from the lower end of the base. Each holding leg includes a transition arm extending downward from the lower end of the base and a welding portion extending downward from the transition arm. The welding portion is formed with a substantially arc-shaped inner edge. The inner edge of the holding leg defines a claw structure to retain a solder ball with the insulating housing corporately.

20 Claims, 15 Drawing Sheets

US 8,323,038 B2

ELECTRICAL CONNECTOR AND TERMINAL THEREOF

CROSS-REFERENCE TO RELATED APPLICATIONS

This Application is a Continuation-in-Part of application Ser. No. 12/930,582, filed Jan. 11, 2011, now allowed, and entitled ELECTRICAL CONNECTOR AND TERMINAL THEREOF.

BACKGROUND OF THE INVENTION

1. Field of the Invention

The present invention relates to an electrical connector and a terminal thereof, and more particularly to a land grid array electrical connector and a terminal thereof for electrically connecting a chip module to a circuit board.

2. Description of the Related Art

China patent 200720056219.9 discloses an electrical connector connecting to a circuit board. The electrical connector includes a plurality of terminals. The terminal has a base, and one side of the base extends to form a flexible arm. The flexible arm includes a contact arm that extends upward and a retaining portion that extends downward. The upper end of the base has one upward extension forming a carrier strip connecting portion and one downward extension forming a connecting portion which further extends downward to form a welding portion.

The base is located in a receiving slot of an insulating housing. The contact arm of the terminal exposes to the outside of the insulating housing. One side of the welding portion of the terminal has a hook for being wedged in a convex portion of the receiving slot to prevent the terminal from moving upward. The retaining portion of the terminal is received in a concave receiving portion of the insulating housing.

The terminal discussed above has the following characteristics. When the contact arm is pressed by an electronic component, at least one part of the retaining portion will contact the interior of the receiving concave portion. The retaining portion can absorb the external force and reduce the stress transmitted to the welding portion, thus minimize the risk of solder-crack. However, the conventional terminal still has the following drawbacks.

On a conventional terminal, such as disclosed in the referenced patent, when a solder ball is inserted and presses against the welding portion, the welding portion elastically moves away from the solder ball. When the solder ball reaches the prearranged position, an elastic restoring force exerted on the solder ball by the welding portion is limited as the welding portion extend vertically downwards, which leads to a small elastic restoring force and slow elastic restoration, so that the welding portion cannot be in close interference with the solder ball, the solder ball may fall off, resulting in poor connection between the terminal and the circuit board.

SUMMARY OF THE INVENTION

One particular aspect of the present invention is to provide a terminal that can provide a firm connection to the circuit board.

The terminal is received in a receiving slot of an insulating housing, and includes a base having an upper end and a lower end, a flexible arm extending upward from the upper end of the base, a retaining portion extending upward from the upper end of the base and at least one holding leg. A first predetermined distance is between the flexible arm and the retaining portion. Each holding leg includes a transition arm extending obliquely and downward from the lower end of the base, and a welding portion extending downward from the transition arm at a slanting angle. The at least one welding portion is inclined toward the base. The at least one welding portion is formed with a substantially arc-shaped inner edge. The inner edge of the holding leg defines a claw structure to retain a solder ball with the insulating housing corporately.

Another particular aspect of the present invention is to provide an electrical connector that can establish firm connection between an electrical component and a circuit board.

The electrical connector includes an insulating housing having a plurality of receiving slots which are disposed in a staggered configuration, and a plurality of terminals received in the receiving slots correspondingly. Each of the terminals includes a base having an upper end and lower end, a flexible arm extending upward from the upper end of the base, a retaining portion and a holding leg. The retaining portion extends upward from the upper end of the base and adjacent to the flexible arm. The holding leg includes a transition arm extending obliquely and downward from the lower end of the base, a curve portion extending curvedly and downward from a lower end of the transition arm, and a welding portion extending downward from the curve portion. The welding portion is inclined toward the base. The lower end of the base is formed with a blocked edge adjacent to the transition arm. The protrusions are faced toward the welding portions correspondingly. The welding portion and the curve portion are formed with a substantially arc-shaped lateral edge. Each one of the protrusion portions and the corresponding welding portion define a secure holding structure to hold firmly a solder ball there between.

The electrical connector of the instant disclosure has at least one welding portion that is inclined toward the base and holds a solder ball, thereby providing a secure connection between the electrical connector and the circuit board.

For better understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Figure 1:
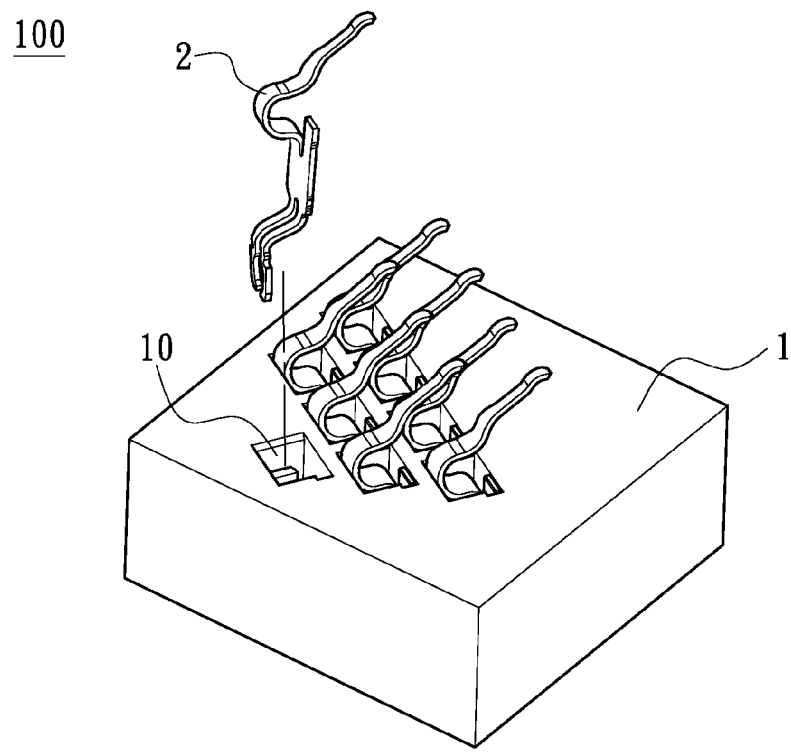
FIG. 1 is a perspective view of an electrical connector of a first embodiment of the present invention.
Figure 2:
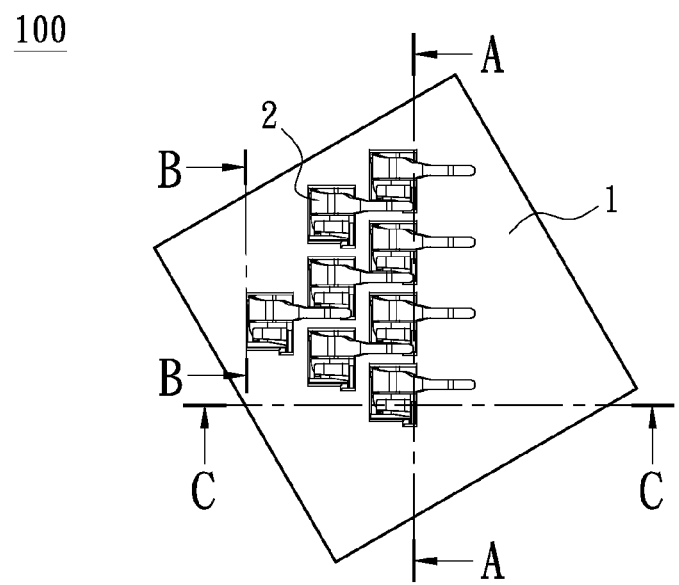
FIG. 2 is a top view of the electrical connector of FIG. 1.

Referring to FIGS. 1 and 2. The electrical connector 100 includes an insulating housing 1 with a plurality of receiving slots 10, a plurality of terminals 2 received in the insulating housing 1, and soldering materials (shown as solder balls 3 in FIG. 8) that located below the terminals 2. A flange extends from a top surface of the insulating housing for receiving a chip module.

Figure 4:
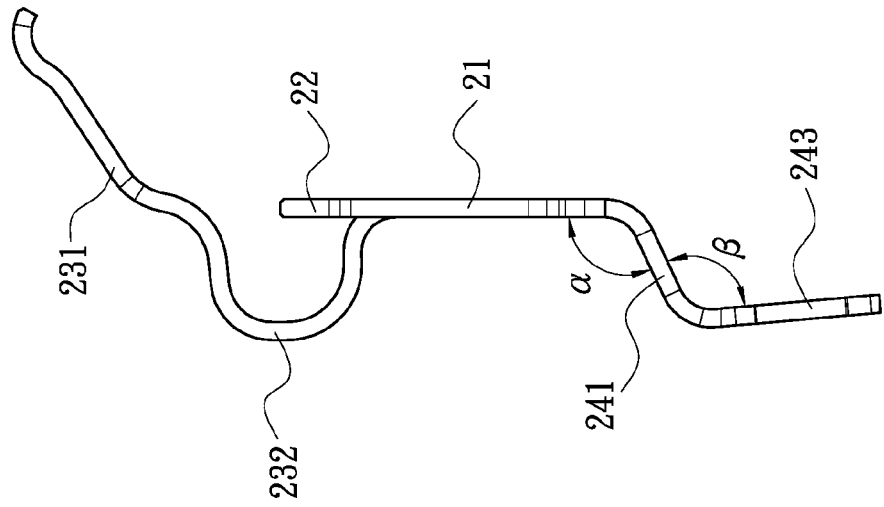
FIG. 4 is a side view of the terminal of FIG. 1.
Figure 3:
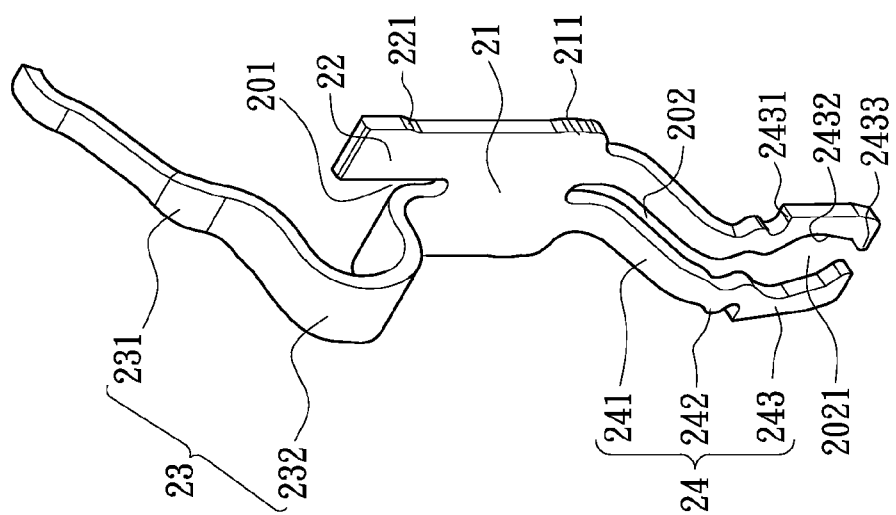
FIG. 3 is a perspective view of the terminal of FIG. 1.

Referring to FIGS. 3 and 4, the terminal 2 includes a flat base 21 having an upper and a lower ends. The upper end of the base 21 has one upward extension forming a retaining portion 22 and one upward extension forming a flexible arm 23. The flexible arm 23 and the retaining portion 22 stand next to each other with a first predetermined distance 201 in between. The upper portion of the retaining portion 22 has a larger width than the lower portion, which forms a gradient 221. The retaining portion 22 and the base 21 are coplanar, but the flexible arm 23 is not. The flexible arm 23 comprises a contact arm 231 and a bending portion 232 extending from the base 21. The outer side edge of the base 21 expands symmetrically outward near the lower end to form an interference portion 211.

The lower end of the base 21 extends downward to form a pair of holding legs 24, and each holding leg 24 comprises a transition arm 241, a blocking portion 242, and a welding portion 243. The pair of transition arms 241 extends downward from the base 21 with a slope and stand next to each other with a second predetermined distance 202 in between. Looking from the side (as shown in FIG. 4), the holding leg 24 and the bending portion 232 are disposed at the same side of the base 21. The transition arms 241 are coplanar, rising from the base 21 at a first angle α. In one embodiment, the first angle α is an obtuse angle of 115 degrees (as shown in FIG. 4). The welding portions 243 are also coplanar. The plane on which the welding portion 243 lies forms a second angle β with the plane of the transition arm 241 which is smaller than the first angle α. One end of the transition arm 241 extends and protrudes outward to form the blocking portion 242, and the blocking portion 242 and the welding portion 243 are coplanar and inclined toward the base 21. In between the welding portion 243 and the block portion 242 lies a shoulder 2431. The welding portion 243 is formed with a substantially arc-shaped inner edge. The pair of inner edges 2432 looks like a parenthesis (as shown in FIG. 4), and define a receiving space 2021.

Figure 6:
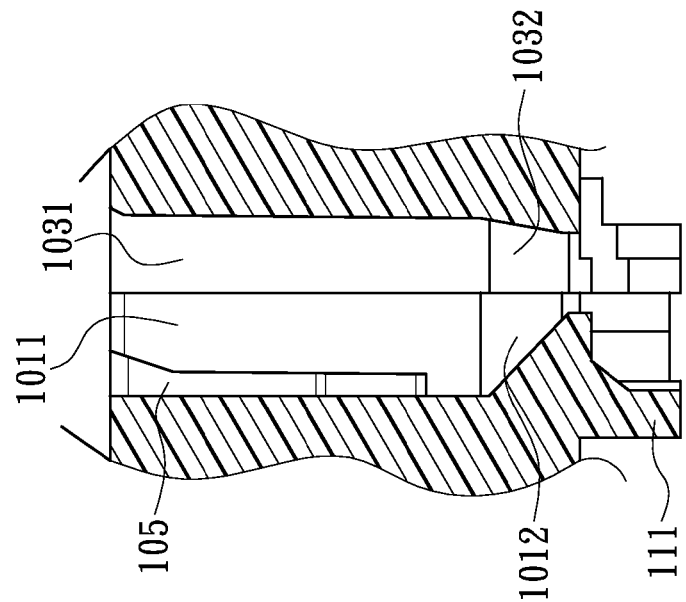
FIG. 6 is a cross-sectional view taken along the line D-D in FIG. 5.
Figure 5:
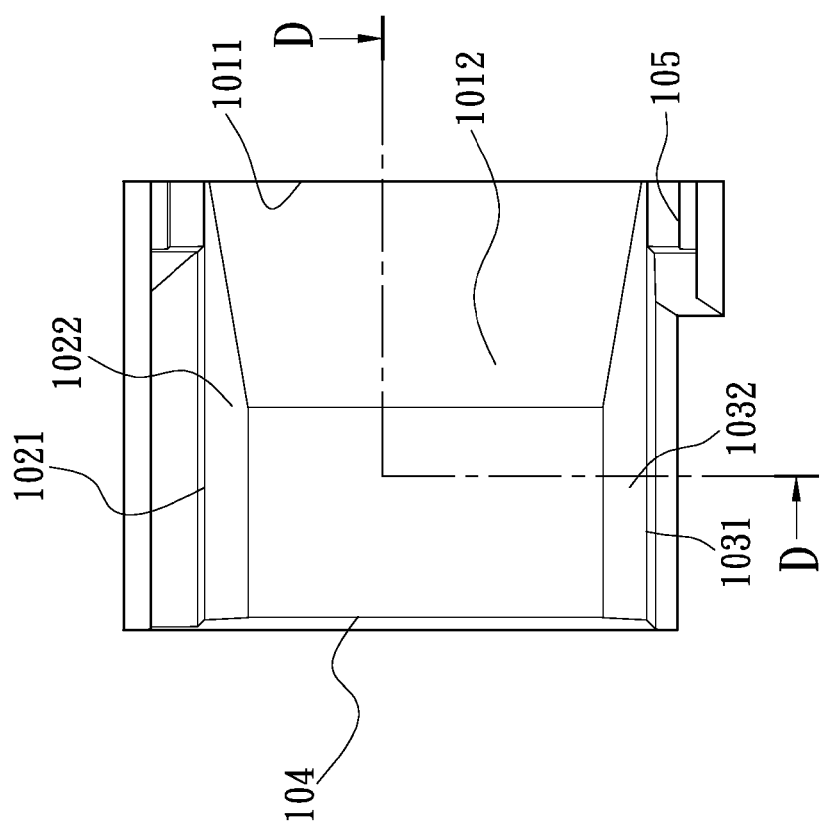
FIG. 5 is a top view of the receiving slot of FIG. 4.

Referring to FIGS. 5 and 6, the insulating housing 1 has a plurality of receiving slots 10, and the receiving slots 10 are disposed in a staggered configuration viewing from the top of the insulating housing 1. Each receiving slot 10 is a through-hole for receiving a terminal 2 correspondingly. Referring to FIG. 5, the opening of the receiving slot 10 is larger near the top surface of the insulating body 1 and smaller near the bottom surface, which forms a funnel-like shape. The receiving slot 10 is formed by a first inner wall, a second inner wall, a third inner wall, and a fourth inner wall (shown as inner wall 104 in FIG. 5). The first inner wall stands opposite to the fourth inner wall 104, and the second inner wall stands opposite to the third inner wall.

Referring to FIGS. 5 and 6, the first inner wall has a first vertical portion 1011 as the upper part and a first sloping portion 1012 as the lower part. The second inner wall has a second vertical portion 1021 as the upper part and a second sloping portion 1022 as the lower part. The third inner wall has a third vertical portion 1031 as the upper part and a third sloping portion 1032 as the lower part. The fourth inner wall 104 has a vertical portion only. The connection portion of the first vertical portion 1011 and the third vertical portion 1031 has a retaining space 105 for receiving the retaining portion 22. The upper part of the retaining space 105 is larger than the lower part for engaging the gradient 221, shown as FIG. 10.

Figure 8:
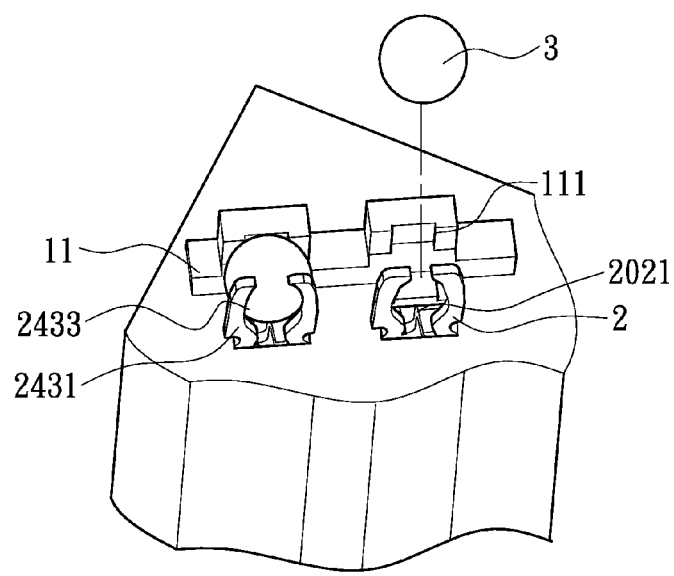
FIG. 8 is another perspective view of the electrical connector of FIG. 1.

Referring to FIG. 8. The bottom face of the insulating housing 1 has bar-shaped platforms 11 protruding from the bottom surface and the platform 11 protrudes downward and extends to form a protrusion portion 111 with a substantially concave surface facing toward the receiving slot 10.

Figure 10:
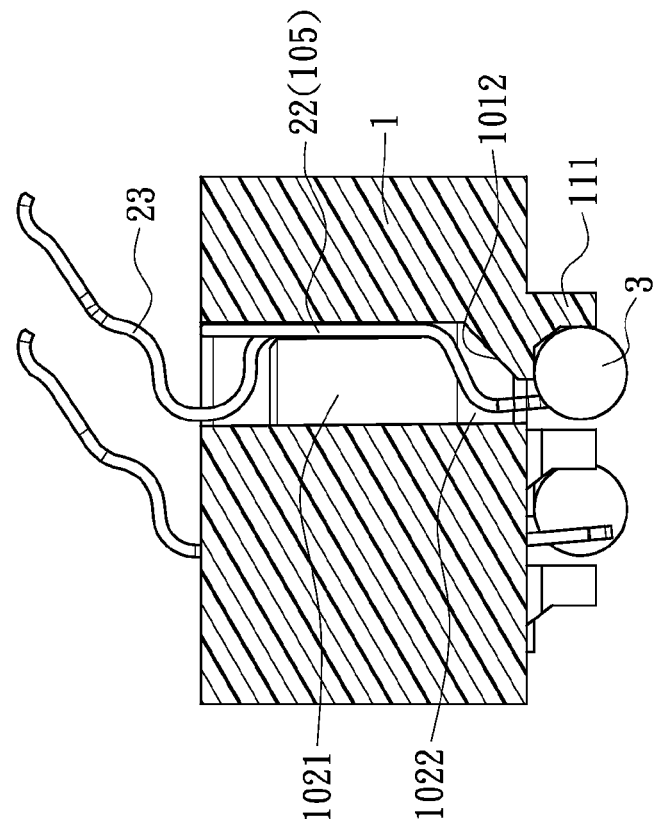
FIG. 10 is a cross-sectional view taken along line C-C in FIG. 2.

Referring to FIGS. 7-10. When the terminal 2 is installed into the receiving slot 10, the contact arm 231 protrudes from the top surface of insulating body 1 for electrical connection with the chip module. Referring to FIG. 10, the welding portion 243 exposes outside of the bottom surface of the insulating housing 1 and the bottom end of the welding portion 243 is under the bottom surface of the protrusion portion 111, which means a third predetermined distance exists between the bottom surface of the protrusion portion 111 and the circuit board. Soldering material, such as a solder ball 3, is disposed between the welding portion 243 and the concave surface of the protrusion portion 111. When the protruding welding portion 243 is then soldered to the circuit board, some melted material is received between the circuit board and the bottom surface of the protrusion portion 111.

Figure 11:
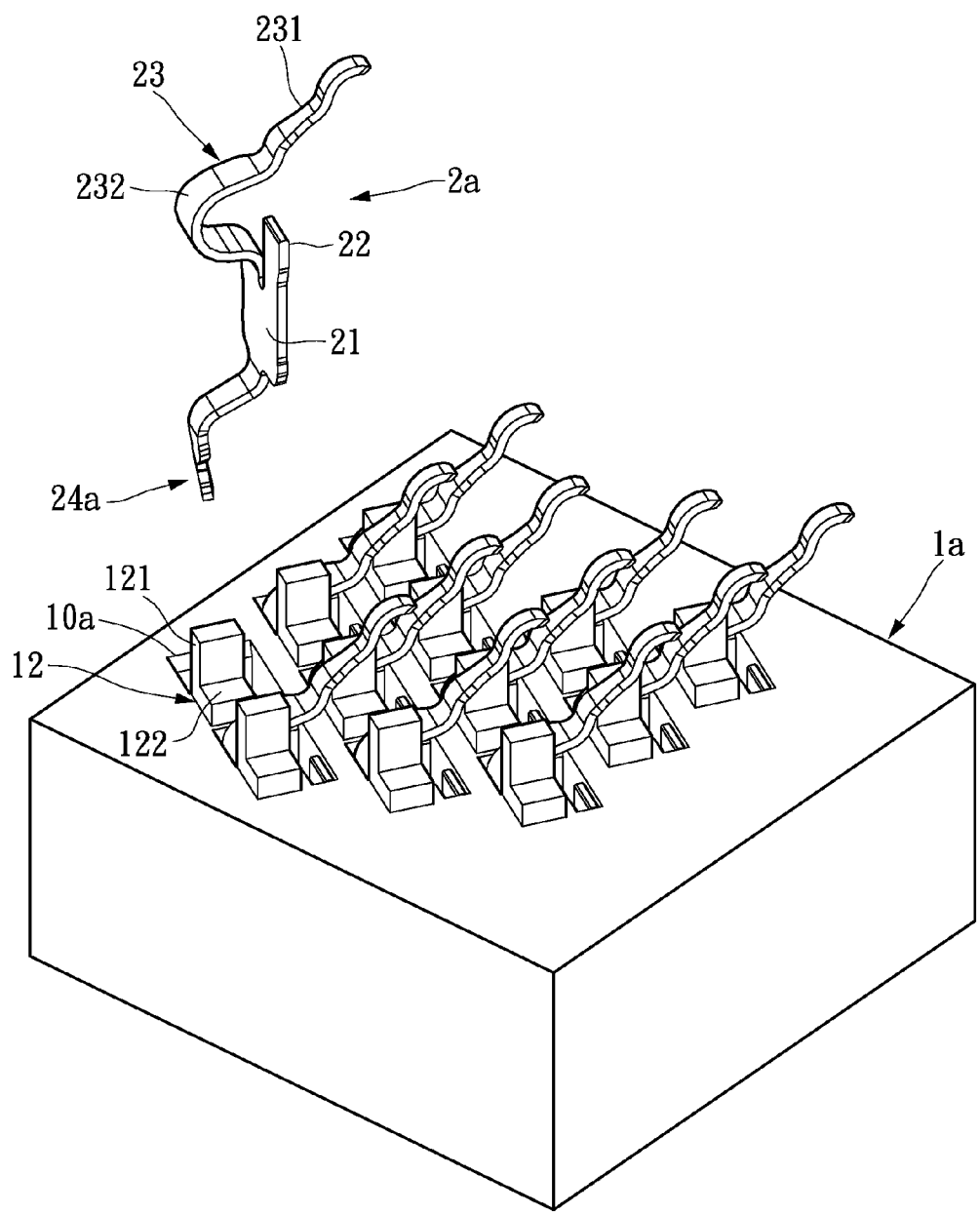
FIG. 11 is a perspective view of the electrical connector of a second embodiment of the present invention.
Figure 11A:
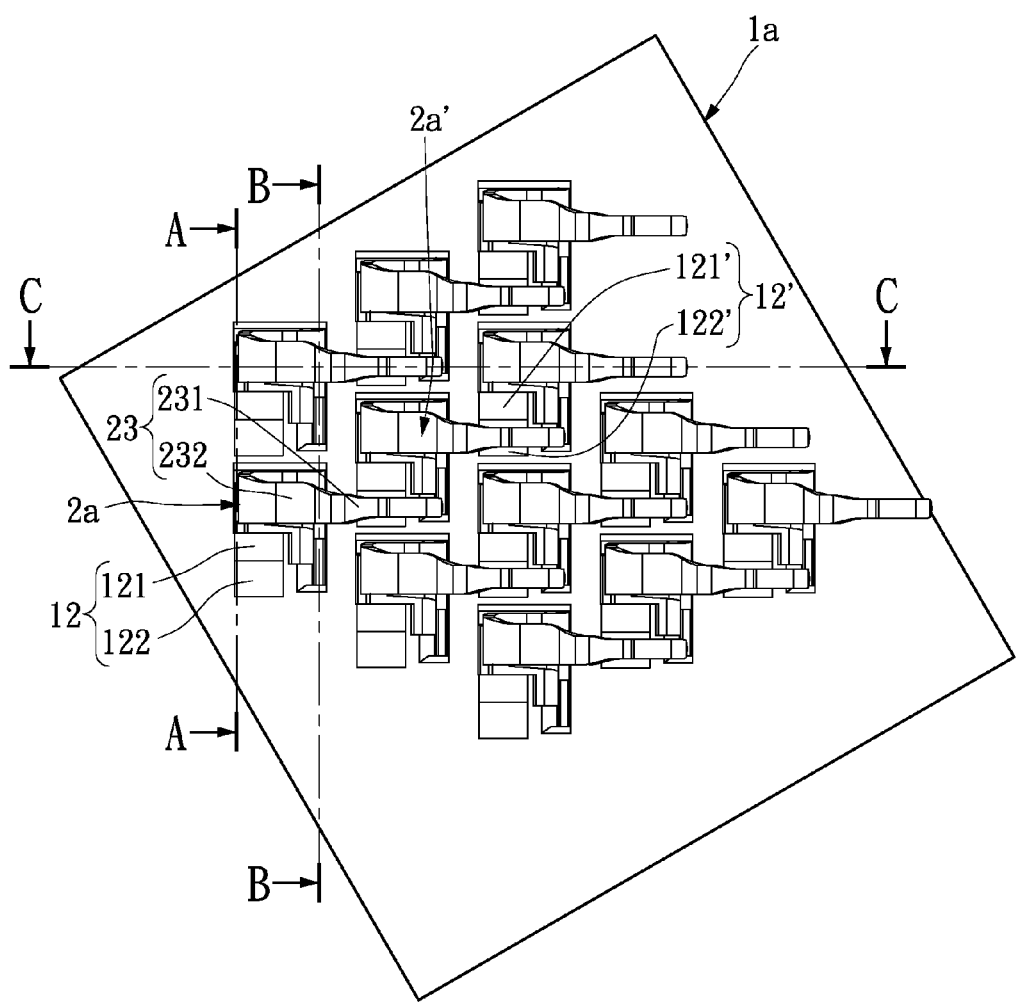
FIG. 11A is a top view of the electrical connector of FIG. 11.

Referring to FIGS. 11 and 11A, which are a perspective view of the electrical connector of second embodiment according to the present invention. In this present embodiment, the electrical connector 100a includes an insulating housing 1a and a plurality of terminals 2a. The main difference between the terminal 2a and the above-mentioned embodiment is a single holding leg 24a extended from the base 21 of the terminal 2a. The insulating housing 1a further has a plurality of resting protrusions 12 protruded from a top surface thereof corresponding to the receiving slots 10a. Each of resting protrusion 12 has a first portion 121 and a second portion 122 connected with the first portion 121. In the same one of receiving slot 10a, the first portion 121 is arranged adjacent to the bending portion 232 of the terminal 2a and is higher than the bending portion 232. The receiving slots 10a are also disposed in a staggered configuration viewing from the top of the insulating housing 1a. Referring to FIG. 11A, the second portion 122' of the resting protrusion 12' is used to support the contact arm 231 of one neighbor terminal 2a' in another row of receiving slot. In this embodiment, the first portion 121' is used to guide the flexible arm 23 to a vertical movement to avoid from slanting and contacting to another flexible arm. One side of the first portion 121' can guide not only the contact arm 231 of one terminal at one rear neighbor row, but also the bending portion 232 of one terminal at the same row. The second portion 122' is used to limit the vertical displacement to protect the flexible arm from elastic fatigue.

Figure 12:
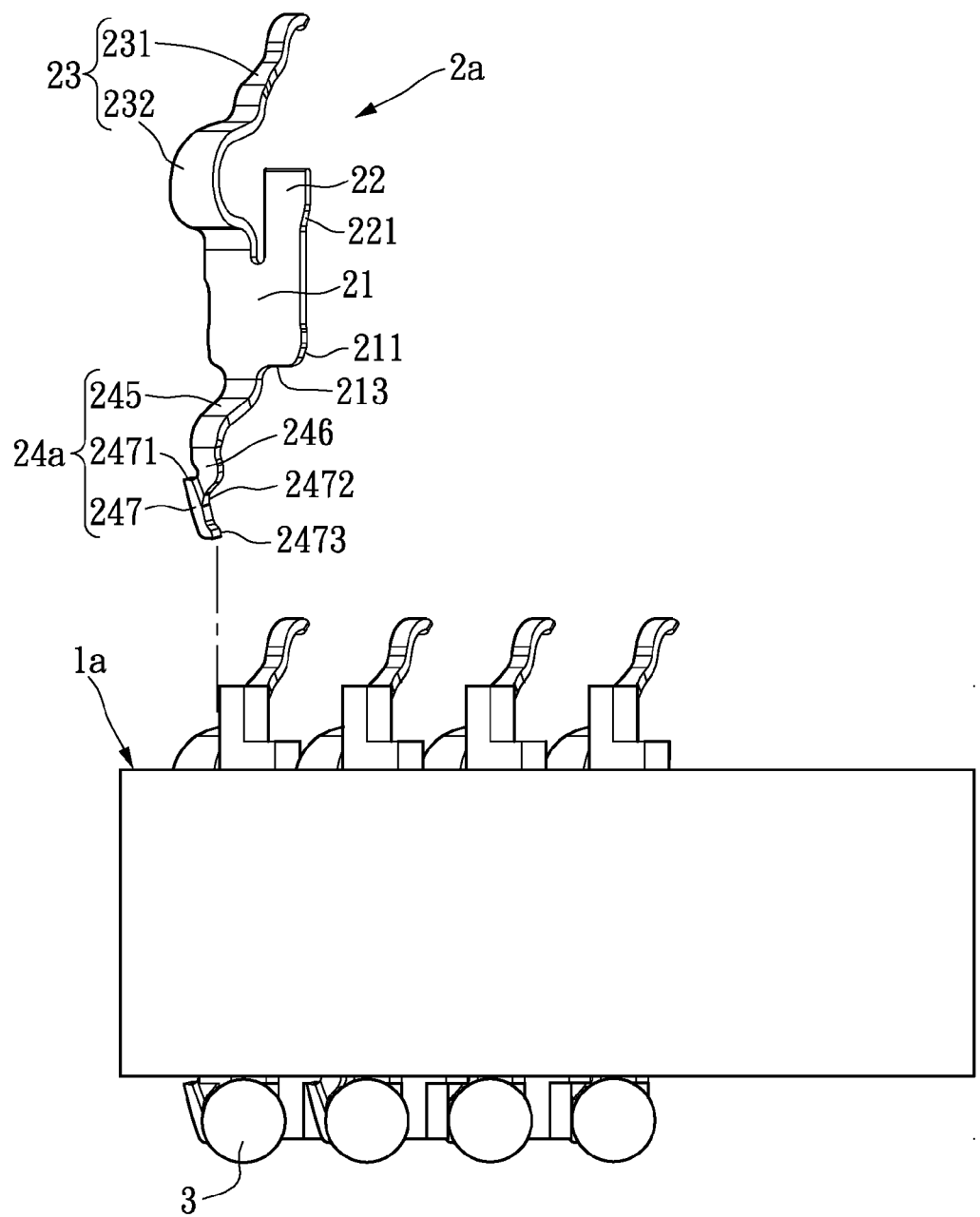
FIG. 12 is a side view of the electrical connector of FIG. 11.

Referring to FIG. 12. The holding leg 24a of the terminal 2a in this embodiment has a transition arm 245, a curve portion 246 and a welding portion 247. The transition arm 245 extends obliquely and downward from a part of the lower end of the base 21. The curve portion 246 extends curvedly and downward from a lower end of the transition arm 245. The welding portion 247 extends downward from the curve portion 246, and is inclined toward the base 21. The welding portion 247 and the curve portion 246 are formed with a substantially arc-shaped lateral edge 2472. The lateral edge of the holding leg 247 defines a claw structure to retain (or grasp) the solder ball 3 with the insulating housing 1a.

A top end of the welding portion 247 has a shoulder 2471 protruded toward an outer side opposite to the curve portion 246. The shoulder 2471 is arranged beyond a bottom surface of insulating housing 1a and is blocked by the bottom surface of the insulating housing 1a. The welding portion 247 includes a hook 2473 formed at a lower end thereof.

Figures 12A, 12B:
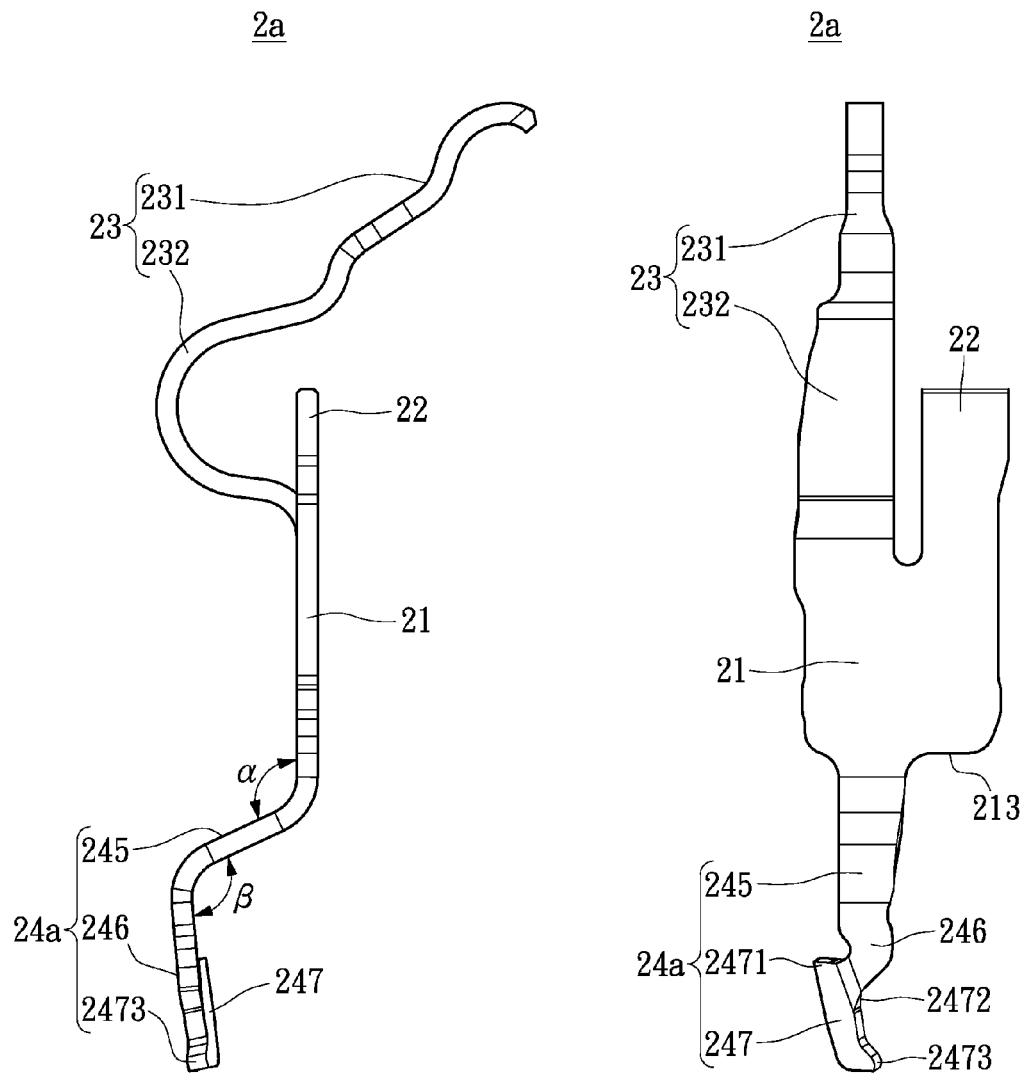
FIG. 12A is a side view of the terminal of second embodiment according to the present invention.
FIG. 12B is a rear view of the terminal of second embodiment according to the present invention.

Referring to FIGS. 12A and 12B. The terminal 2a has another difference from the first embodiment, that the lower end of the base 21 is formed with a blocked edge 213. A width of the blocked edge 213 is substantially equal to that of the retaining portion 22. The transition arm 245 is substantially aligned with the flexible arm 23. The blocked edge 213 of the base 21 is substantially aligned with the retaining portion 22 and adjacent to the transition arm 245.

Referring to FIG. 12A. The base 21 is plate-shaped and defines a first and second side surfaces in a parallel manner. According to the FIG. 12A, the left side is defined as the first side surface, and the right side is defined as the second side surface. The transition arm 23 has a bending portion 232 and a contact arm 231. The bending portion 232 extends from the upper end of the base 21 toward the first side surface and then toward the second side surface. The contact arm 231 extends from the bending portion 232 and beyond the second side surface. A first included angle α between the transition arm 245 and the base 21 is an obtuse angle, and a second included angle β between the transition arm 245 and the curve portion 246 is an obtuse angle. The second included angle β is smaller than the first included angle α.

In this embodiment, the curve portion 246 and the welding portion 247 is non-coplanar, and the welding portion 247 is slanted toward the base 21. As shown in FIG. 12A, the welding portion 247 is bent toward the second side surface. Such structure can be deemed as a portion of the claw structure in this embodiment, which forms a claw curved surface toward the solder ball 3 and can function as a shovel to prop up the solder ball 3. The welding portion 247 and the curve portion 246 forms a bent surface like a spoon to spoon up or scoop up the solder ball 3. Therefore, it can support the solder ball 3 to avoid from falling off.

Figure 13:
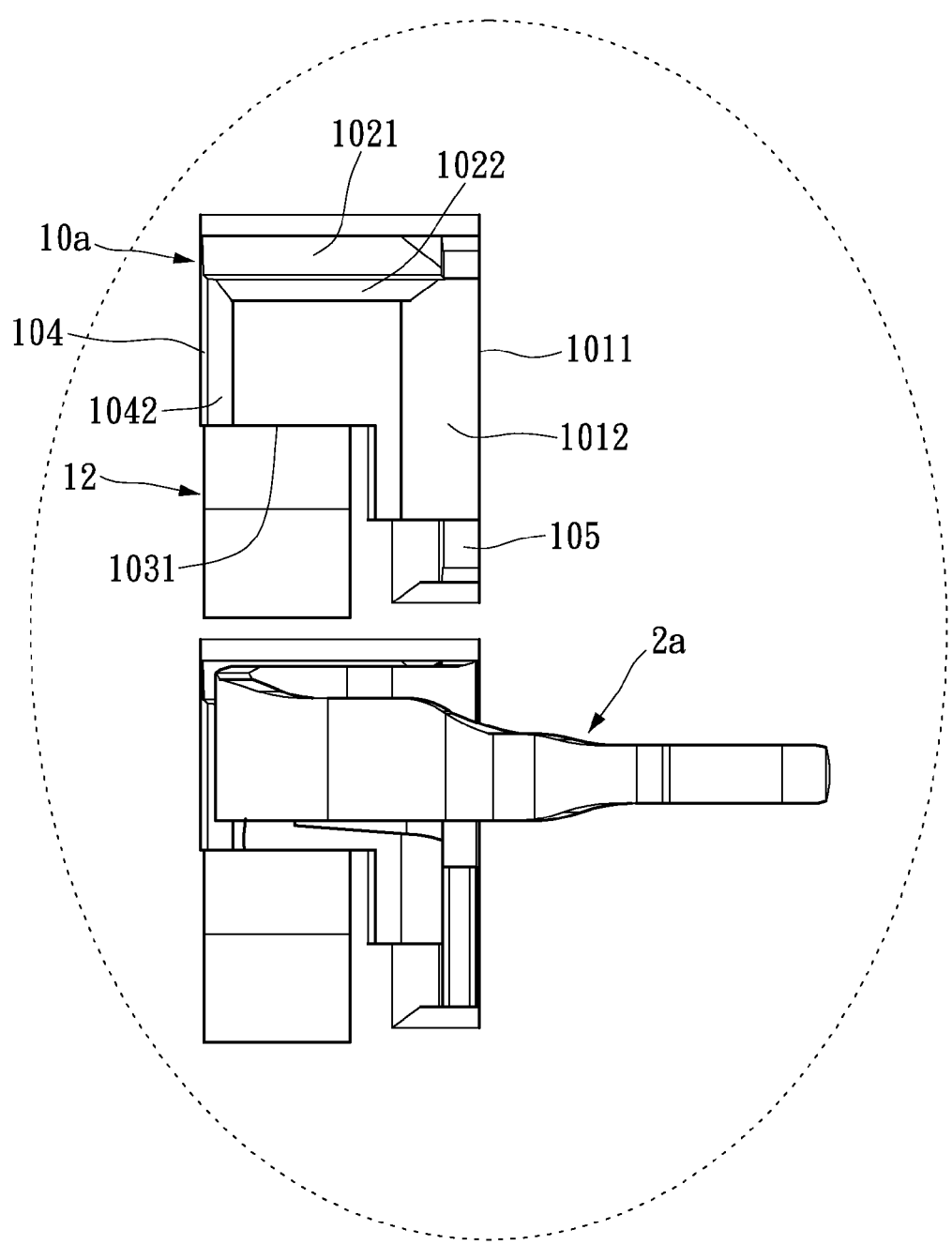
FIG. 13 an enlarged top view of the receiving slot of second embodiment according to the present invention.
Figure 14:
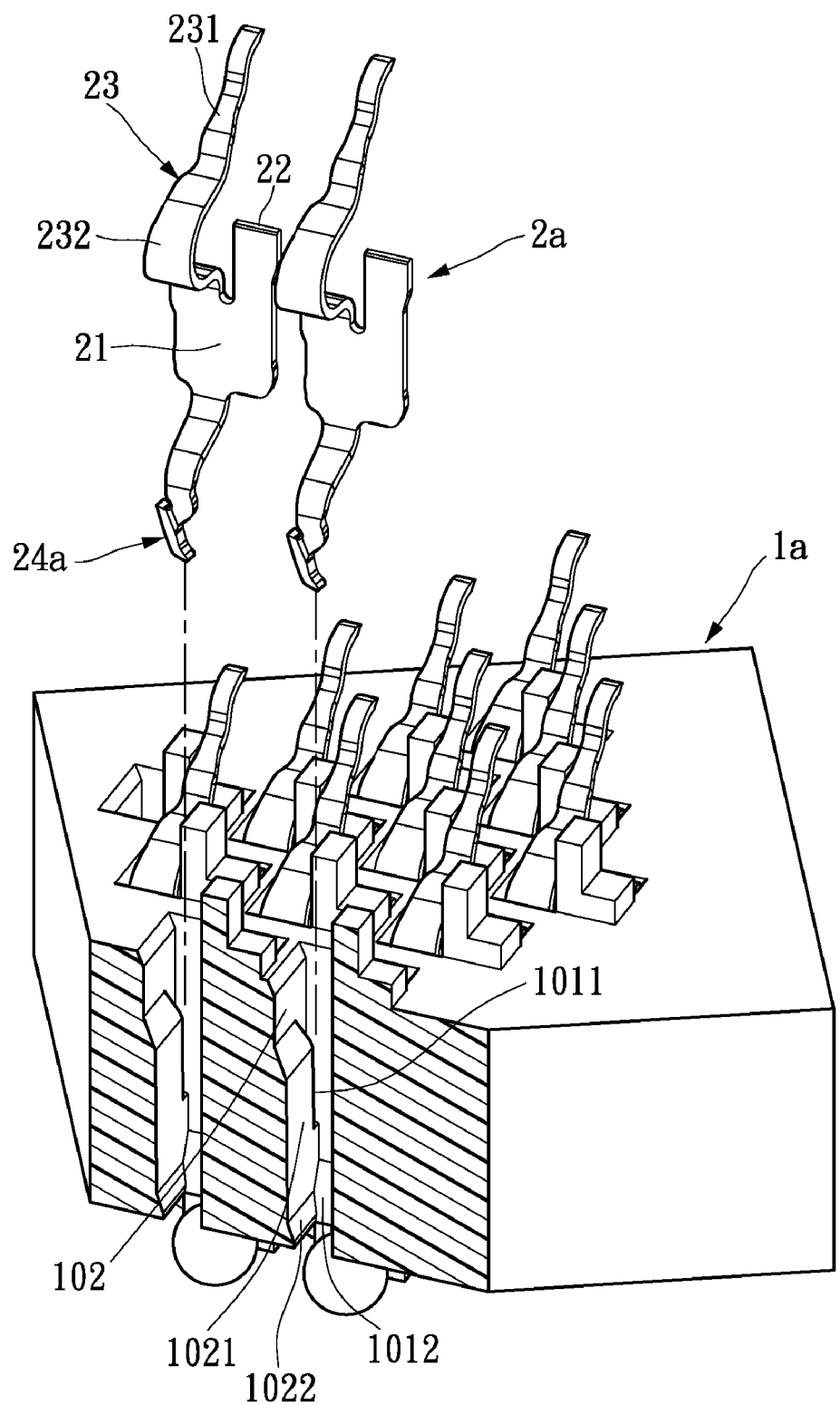
FIG. 14 is a perspective cross-sectional view taken along line A-A in FIG. 11A.

Referring to FIGS. 13 and 14. The receiving slot 10a is similar to the receiving slot 10 in the first embodiment, and is formed by a first inner wall, a second inner wall, a third inner wall, and a fourth inner wall (shown as inner wall 104 in FIG. 13). The first inner wall stands opposite to the fourth inner wall 104, and the second inner wall stands opposite to the third inner wall. The resting protrusion 12 is formed through the receiving slot 10a and protruded from the third inner wall. The third vertical portion 1031 is formed on one side of the resting protrusion 12. The fourth inner wall 104 has a fourth sloping portion 1042 opposite to the first sloping portion 1012.

Figure 15:
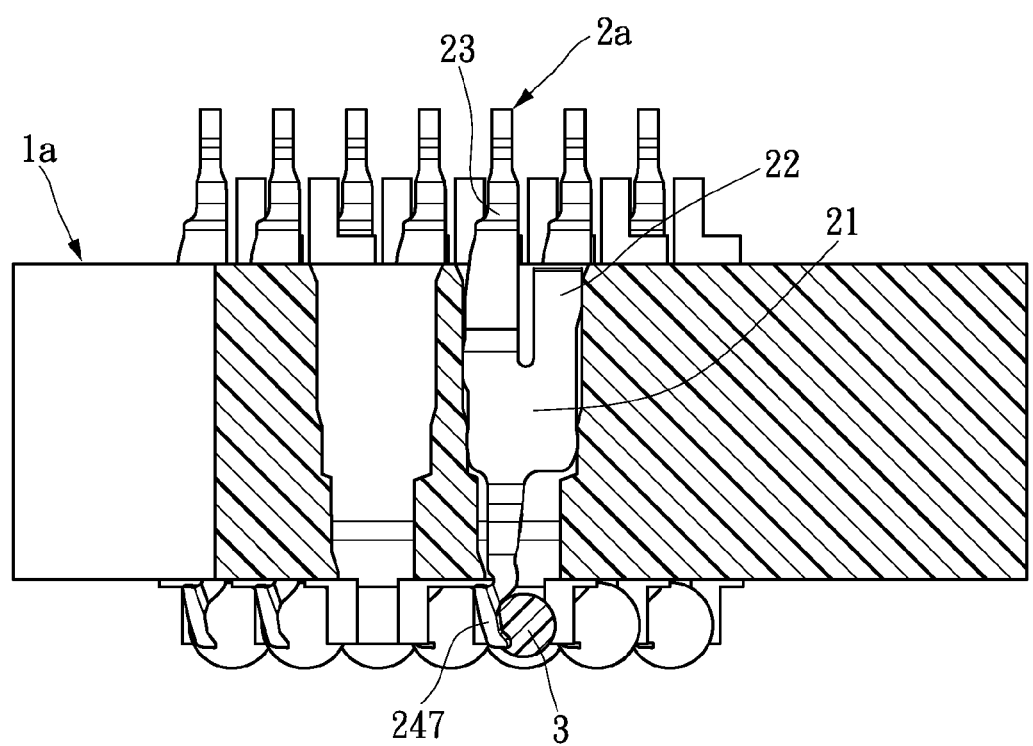
FIG. 15 is a cross-sectional view taken along line B-B in FIG. 11A.
Figure 16:
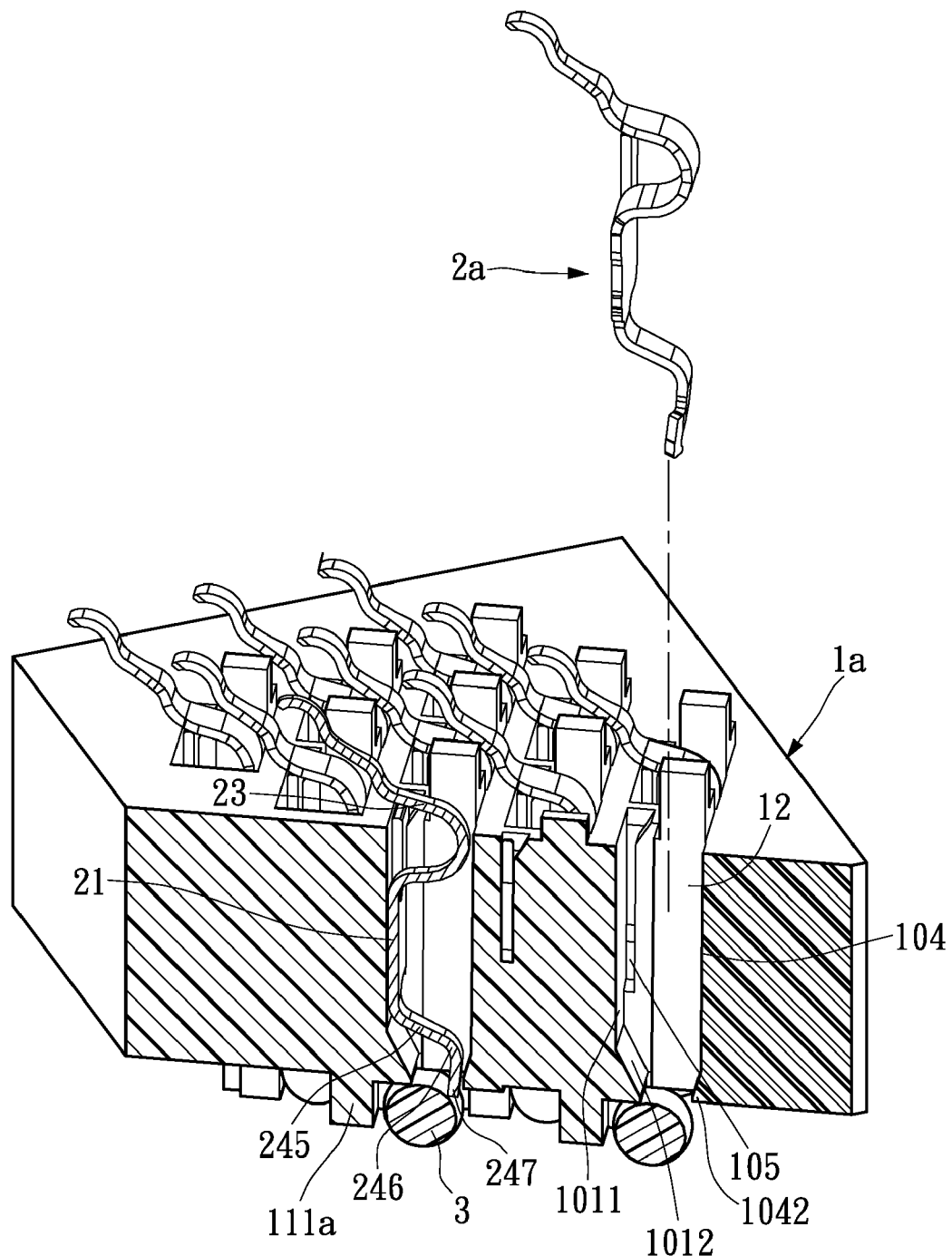
FIG. 16 is a perspective cross-sectional view taken along line C-C in FIG. 11A.

Referring to FIGS. 15 and 16. The base 21 is disposed adjacent to the first vertical portion 1011. The transition arm 245 is blocked by the first sloping portion 1012, and the welding portion 247 is leaned against the fourth sloping portion 1042.

Figure 17:
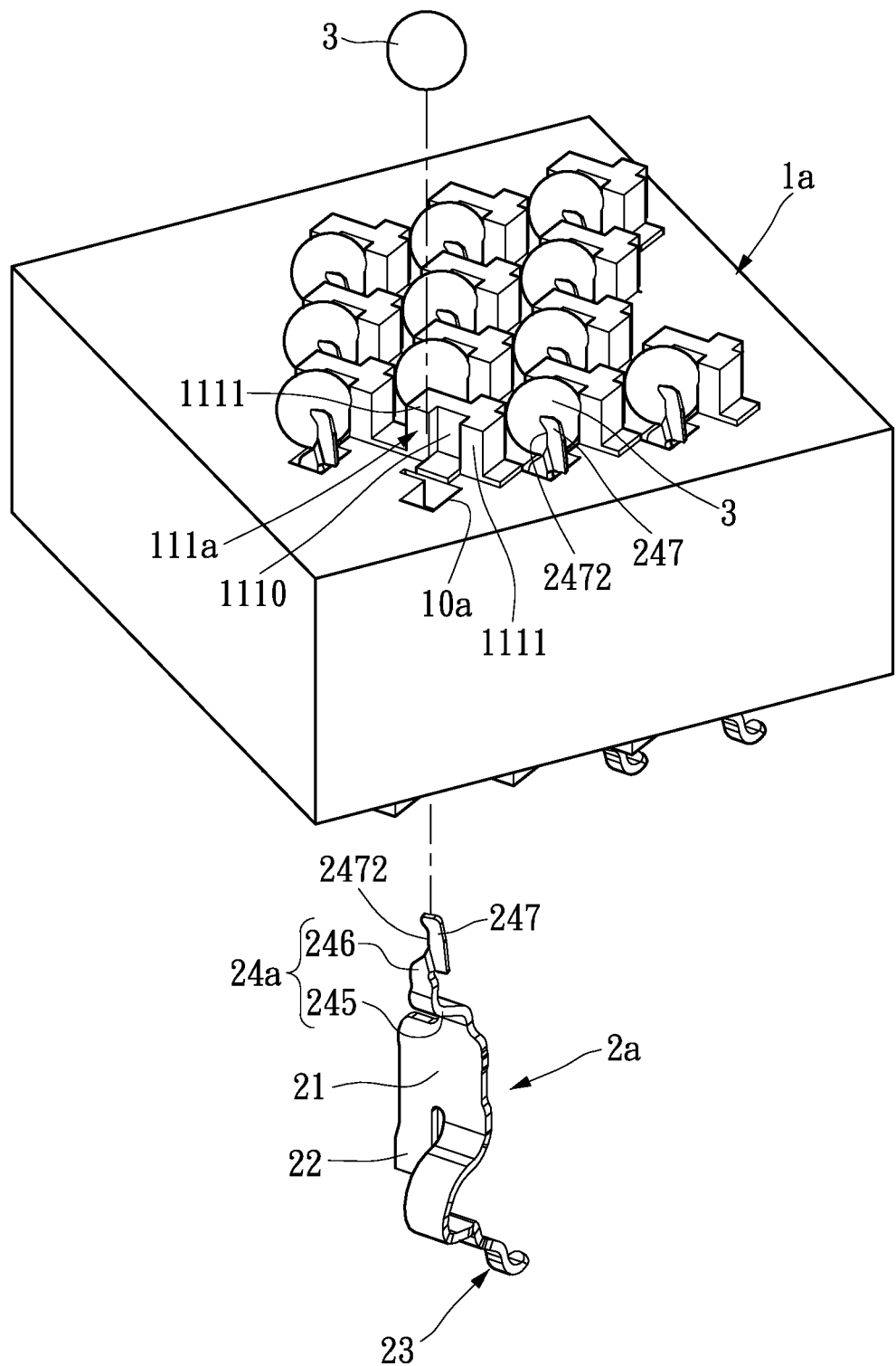
FIG. 17 is another perspective view of the electrical connector of second embodiment according to the present invention.
Figure 18:
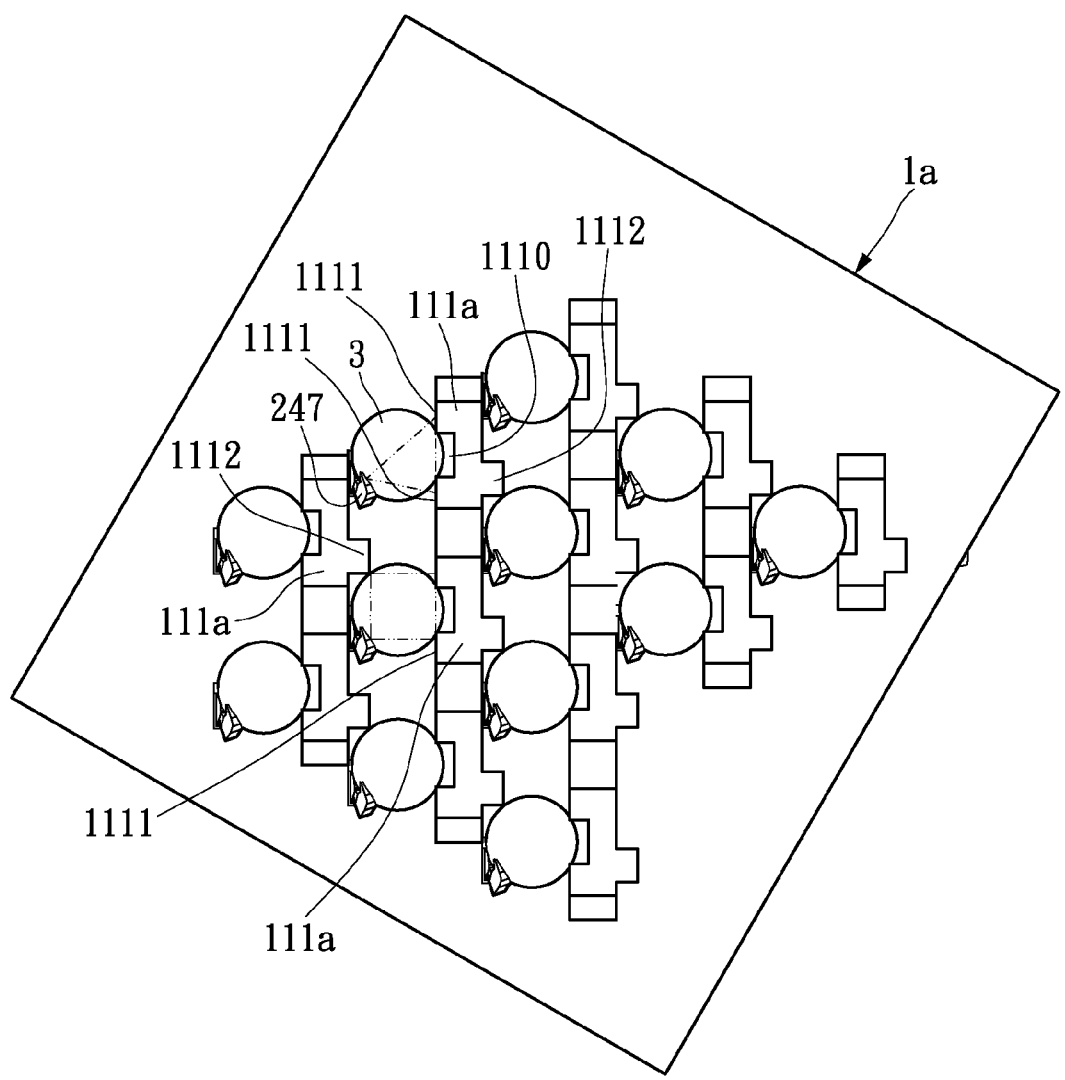
FIG. 18 is a bottom view of the electrical connector of second embodiment according to the present invention.

Referring to FIGS. 17 and 18. In this embodiment, the insulating housing 1 has a plurality of protrusion portions 111a protruded from the bottom surface thereof. Each of the protrusion portions 111a has two side-protrusions 1111. The two side-protrusions 1111 and the corresponding welding portion 247, which are disposed around the same receiving slot 10a, are arranged in a triangle. The two side-portions 1111 and the corresponding welding portion 247 are arranged in a triangle-shape claw (or a grasp) structure, so that the solder ball 3 can be held firmly there between.

Referring to FIG. 18. In this embodiment each of the protrusion portions 111a further includes a ridge-protrusion 1112, which is protruded opposite to the two side-protrusions 1111. The ridge-protrusions 1112 are aligned with the welding portions 247. The ridge-protrusion 1112, the corresponding welding portion 247 and the two side-protrusions 1111, which are arranged around the same receiving slot 10a, form a quadrangle-shape claw (or a grasp) structure to hold firmly the solder ball 3 there between.

The electrical connector 100 and the terminal 2 (2a) of the present invention have the following advantageous characteristics.

1. The terminal 2 of the first embodiment has two welding portions 243, and both the number of soldering points and soldering surface are increased for ensuring a firmer connection to the circuit board. Each inner edge 2432 of the welding portion 243 between the holding legs 24 is substantially arc-shaped. The arced inner edges 2432 between the holding legs 24, together with the protrusion portion 111 of the insulating housing 1, cooperatively define a claw structure that is capable of retaining a solder ball 3 in place.

2. The holding leg 24 of first embodiment has a pair of sloping transition arms 241 separated by the second predetermined distance. When an external force is exerted, the sloping portion of the transition arms 241 absorbs the external force better, thus serving as a buffer to reduce oscillation. The stress transmitted to the welding portion 243 is therefore reduced to minimize risk of solder crack.

Figure 7:
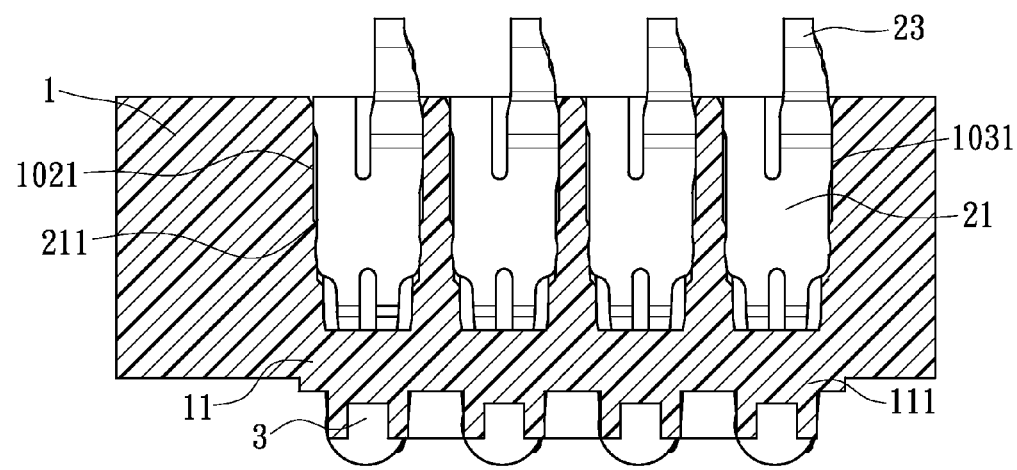
FIG. 7 is a cross-sectional view taken along line A-A in FIG. 2.

3. Referring to FIG. 7, the two interference portions 211 engage tightly the second vertical portion 1021 and the third vertical portion 1031, which effectively reduces the lateral movement of the terminal 2 in the receiving slot 10.

Figure 9:
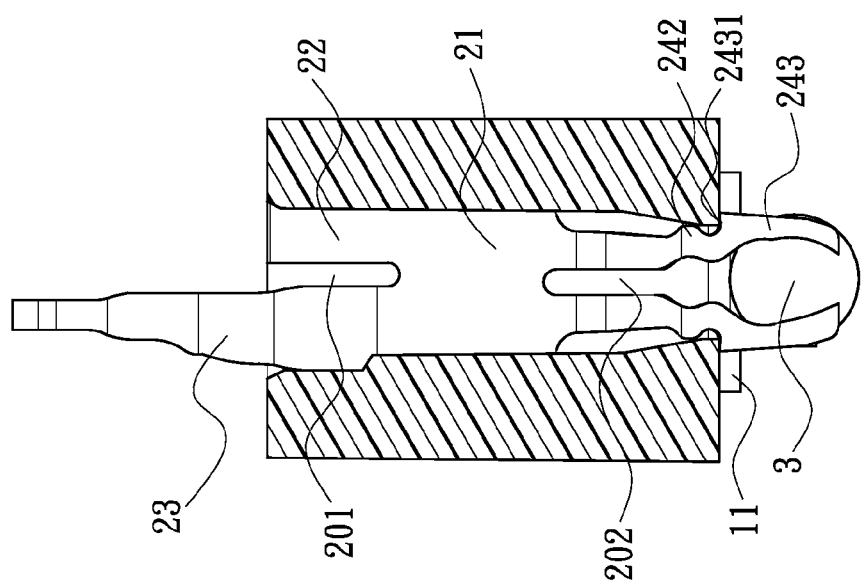
FIG. 9 is a cross-sectional view taken along line B-B in FIG. 2.

4. Referring to FIG. 9, the pair of blocking portion 242, which is disposed near the bottom surface of the receiving slots 10, corresponds to the second sloping portion 1022 and the third sloping portion 1032 respectively. The lateral movement of welding portion 243 is limited, which is good for the solder ball 3 held by the terminal 2.

5. Referring to FIG. 9, the shoulder 2431 is engaged to the bottom surface of the insulating housing 1 to prevent the terminal 2 from moving upwards under the external force, thereby establishing a firm connection between the terminal 2 and the circuit board.

6. Referring to FIG. 8, a part of the solder ball 3 entering the receiving space 2021 will be held firmly by the two hooks 2433, while another part of the solder ball 3 presses against the protrusion portion 111. Thus, the solder ball 3 will not be easily dropped after installation.

7. As shown in FIG. 2, the free end of the flexible arm 23 of the terminal 2 in a row is situated between two adjacent flexible arms 23 of the corresponding terminals in a front adjacent row, and the free end of the flexible arm 23 of the terminal 2 in a row is situated right above the retaining portion 22 of the corresponding terminal in a front adjacent row. The staggered configuration of the receiving slots provides a distribution of the high-density terminals in the insulating housing 1. Also, because of the efficient arrangement, a longer contact arm 231 may be used. The flexibility of the contact arm 231 to the chip module is therefore enhanced. Higher density terminals and longer contact arms contribute to better transmission of electrical signals.

8. The funnel shape of the receiving slots 10 effectively restricts the movement of the holding leg 24, therefore enables a secure connection between the welding portion 243 and the circuit board.

9. The protrusion portion 111, having a concave surface facing the receiving slot 10, establishes a secure holding structure with the welding portion 243. The solder ball 3 is therefore held firmly between the protrusion portion 111 and the welding portion 243.

10. In second embodiment, the terminal 2a only has one the holding leg 24a. The holding leg 24a of second embodiment only has one welding portion 247. The holding leg 24a is formed with a substantially arc-shaped inner edge, and the inner edge of the holding leg 24a defines a claw structure to retain the solder ball 3 with the insulating housing 1a corporately.

11. In second embodiment, the lower end of the base 21 of the terminal 2a has the blocked edge 213, which is longer than the first embodiment and can be retained in the receiving slot 10a more firmly, as shown in FIG. 15, compared with the first embodiment as shown in FIG. 9.

12. In second embodiment, the protrusion portions 111a of the insulating housing 1a face toward the welding portions 247 correspondingly. The welding portion 247 and the curve portion 246 are formed with a substantially arc-shaped lateral edge. Each one of the protrusion portions 111a and the corresponding welding portion 247 define a secure holding structure to hold firmly the solder ball 3 there between.

13. In second embodiment, each solder ball 3 can be held by at least three points. A triangle-shape claw structure is formed by the two side-protrusions 1111 and the corresponding welding portion 247, which are disposed around the same receiving slot 10a, so that the solder ball 3 can be held firmly there between.

14. In second embodiment, most of solder balls 3 can be held by four points, which is more stable than the first embodiment. The ridge-protrusion 1112, the corresponding welding portion 247 and the two side-protrusions 1111, which are arranged around the same receiving slot 10a, form a quadrangle-shape claw structure to hold firmly the solder ball 3 there between.

15. In first and second embodiment, when the solder ball is inserted and presses against the welding portion, the welding portion elastically moves away from the solder ball. When the solder ball reaches the prearranged position, because the welding portion is inclined toward the base, the elastic restoring force exerted on the solder ball by the welding portion is large, and the elastic restoration is fast, so that close interference of the welding portion with the solder ball can be ensured, thereby ensuring good connection between the terminal and the circuit board.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A terminal, received in a receiving slot of an insulating housing, comprising:
   a base having an upper end and a lower end;
   a flexible arm extending upward from the upper end of the base;
   a retaining portion extending upward from the upper end of the base, wherein a first predetermined distance is between the flexible arm and the retaining portion;
   at least one holding leg, each holding leg comprising:
      a transition arm extending obliquely and downward from the lower end of the base; and
      a welding portion extending downward from the transition arm at a slanting angle;
   wherein the at least one welding portion is inclined toward the base;
   wherein the at least one welding portion is formed with a substantially arc-shaped inner edge, wherein the inner edge of the holding leg defines a claw structure to retain a solder ball with the insulating housing corporately.

2. The terminal of claim 1, wherein the transition arm is extended from the base at a first angle, wherein the first angle is an obtuse angle.

3. The terminal of claim 1, wherein a blocking portion is disposed between the transition arm and the welding portion, wherein the blocking portion protrudes from the holding leg.

4. The terminal of claim 1, wherein the welding portion comprises a hook formed at a lower end thereof, and a shoulder concaved from an outer edge thereof adjacent to the base, wherein the shoulder is protruded beyond an outer edge of the transition arm to be blocked against a bottom surface of the insulating housing.

5. The terminal of claim 1, wherein the flexible arm comprises a bending portion and a contact arm, the bending portion extends aslant upward to form the contact arm, wherein the bending portion and the holding leg are disposed at the same side of the base.

6. A terminal, received in a receiving slot of an insulating housing, comprising:
   a base having an upper end and a lower end, wherein the lower end of the base is formed with a blocked edge;
   a flexible arm extending upward from the upper end of the base;
   a retaining portion extending upward from the upper end of the base and adjacent to the flexible arm, wherein a width of the blocked edge is substantially equal to that of the retaining portion;
   a holding leg, comprising:
      a transition arm extending obliquely and downward from a part of the lower end of the base;
      a curve portion extending curvedly and downward from a lower end of the transition arm; and
      a welding portion extending downward from the curve portion, wherein the welding portion is inclined toward the base;
   wherein the welding portion and the curve portion are formed with a substantially arc-shaped lateral edge, wherein the lateral edge of the holding leg defines a claw structure to retain a solder ball with the insulating housing.

7. The terminal of claim 6, wherein the base is plate-shaped and defines a first and second side surfaces in a parallel manner, wherein the flexible arm has a bending portion and a contact arm, the bending portion extends from the upper end of the base toward the first side surface and then toward the second side surface, the contact arm extends from the bending portion and beyond the second side surface.

8. The terminal of claim 6, wherein a top end of the welding portion has a shoulder protruded toward an outer side opposite to the curve portion, wherein the shoulder is blocked by a bottom surface of the insulating housing.

9. The terminal of claim 8, wherein the welding portion comprises a hook formed at a lower end thereof.

10. The terminal of claim 6, wherein the bending portion and the holding leg are disposed at the same side of the base.

11. The terminal of claim 6, wherein a first included angle between the transition arm and the base is an obtuse angle, and a second included angle between the transition arm and the curve portion is an obtuse angle, wherein the second included angle is smaller than the first included angle.

12. The terminal of claim 6, wherein the curve portion and the welding portion is non-coplanar, wherein the welding portion is slanted toward the base to spoon up the solder ball.

13. The terminal of claim 6, wherein the transition arm is substantially aligned with the flexible arm.

14. The terminal of claim 13, wherein the blocked edge of the base is substantially aligned with the retaining portion and adjacent to the transition arm.

15. An electrical connector, comprising:
   an insulating housing including:
      a plurality of receiving slots, wherein the receiving slots are disposed in rows and in a staggered configuration; and
      a plurality of protrusion portions protruded from a bottom surface thereof adjacent to the receiving slots correspondingly;
   a plurality of terminals, received in the receiving slots correspondingly, and each of the terminals comprising:
      a base having an upper end and lower end;
      a flexible arm extending upward from the upper end of the base; and
      a retaining portion extending upward from the upper end of the base and adjacent to the flexible arm; and
   a holding leg comprising:
      a transition arm extending obliquely and downward from a part of the lower end of the base, wherein the lower end of the base is formed with a blocked edge adjacent to the transition arm;
      a curve portion extending curvedly and downward from a lower end of the transition arm; and
      a welding portion extending downward from the curve portion, wherein the welding portion is inclined toward the base;
   wherein the protrusion portions face toward the welding portions correspondingly;
   wherein the welding portion and the curve portion are formed with a substantially arc-shaped lateral edge; wherein each one of the protrusion portions and the corresponding welding portion define a secure holding structure to hold firmly a solder ball there between.

16. The electrical connector of claim 15, wherein a flange extends from a top surface of the insulating housing.

17. The electrical connector of claim 15, wherein the free end of the flexible arm of the terminal in a row is situated right above the retaining portion of the corresponding terminal in a front adjacent row.

18. The electrical connector of claim 15, wherein the receiving slot is funnel-shaped, and has an upper opening and a lower opening, wherein the upper opening is larger than the lower opening.

19. The electrical connector of claim 15, wherein each of the protrusion portions has two side-protrusions face toward the corresponding welding portion; and
   wherein the two side-portions and the corresponding welding portion, disposed around the same receiving slot, define a triangle-shape claw structure to hold firmly the solder ball there between.

20. The electrical connector of claim 19, wherein each of the protrusion portions further has a ridge-protrusion protruded opposite to two side-protrusions, wherein the ridge-protrusions are aligned with the welding portions; and
   wherein the ridge-protrusion, the corresponding welding portion and the two side-protrusions, arranged around the same receiving slot, define a quadrangle-shape claw structure to hold firmly the solder ball there between.

* * * * *